US009753479B2

(12) United States Patent
Hafizi et al.

(10) Patent No.: US 9,753,479 B2
(45) Date of Patent: Sep. 5, 2017

(54) MULTI-STANDARD, AUTOMATIC IMPEDANCE CONTROLLED DRIVER WITH SUPPLY REGULATION

(75) Inventors: Madjid Hafizi, San Diego, CA (US); Jie Xu, San Diego, CA (US); Xiaohua Kong, San Diego, CA (US); Nam V. Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 413 days.

(21) Appl. No.: 13/564,150

(22) Filed: Aug. 1, 2012

(65) Prior Publication Data

US 2014/0035549 A1 Feb. 6, 2014

(51) Int. Cl.
*G05F 3/08* (2006.01)
*H04L 25/02* (2006.01)

(52) U.S. Cl.
CPC ............ *G05F 3/08* (2013.01); *H04L 25/0278* (2013.01); *H03F 2200/03* (2013.01); *H04L 25/028* (2013.01)

(58) Field of Classification Search
None
See application file for complete search history.

(56) References Cited

U.S. PATENT DOCUMENTS

| | | | |
|---|---|---|---|
| 6,693,450 B1 * | 2/2004 | Volk et al. | 326/30 |
| 6,720,805 B1 | 4/2004 | Haas | |
| 7,619,448 B2 | 11/2009 | Wu et al. | |
| 7,724,075 B2 * | 5/2010 | Yang et al. | 327/541 |
| 7,769,057 B2 | 8/2010 | Clements et al. | |
| 7,821,290 B2 | 10/2010 | Thomsen | |
| 7,890,287 B2 | 2/2011 | Tian et al. | |
| 2009/0153219 A1 * | 6/2009 | Wu et al. | 327/333 |
| 2010/0066450 A1 | 3/2010 | Palmer et al. | |
| 2010/0201340 A1 * | 8/2010 | Raghavan | 323/311 |
| 2011/0031918 A1 * | 2/2011 | Sugie | 318/400.29 |
| 2011/0031954 A1 * | 2/2011 | Shirasaki | 323/311 |
| 2012/0025800 A1 * | 2/2012 | Dettloff | H04L 25/0272 323/299 |

OTHER PUBLICATIONS

International Search Report—PCT/US2013/053313—ISA/EPO—dated Nov. 4, 2013.

* cited by examiner

*Primary Examiner* — Timothy J Dole
*Assistant Examiner* — Monica Mata
(74) *Attorney, Agent, or Firm* — Qualcomm Incorporated

(57) ABSTRACT

A pre-driver circuit generates a driver bias signal based on a swing command, a driver impedance characteristic, and an input signal. A driver receives the driver bias signal and generates, in response, a driver signal having a swing and having an output impedance corresponding to the bias signal. Optionally, the driver receives power from a switchable one of multiple supply rails, according to the swing. Optionally, the driver has voltage controlled resistor elements and the driver bias signal is generated based on the swing command and a replica of the driver voltage controlled resistor elements.

33 Claims, 6 Drawing Sheets

MULTI-STANDARD, AUTOMATIC IMPEDANCE CONTROLLED DRIVER WITH SUPPLY REGULATION

FIELD OF DISCLOSURE

The present Application for Patent relates to line drivers, more particularly, to active impedance matched transmission cable drivers.

BACKGROUND

In communicating high bit rate signals over a transmission line, one general design objective is a match of the output impedance of the line driver or output buffer, the impedance of the transmission line, and the input impedance of the receiving circuit, i.e., load. If there is an impedance mismatch, unwanted results can include reduced efficiency in signal power transfer and distortion of the received signal. Associated with the reduction in signal power transfer efficiency, there can be increased power dissipation and heat at the output buffer.

Various techniques are known for matching the output impedance of the output buffer to the impedance of a transmission line. However, the known techniques are optimized to either match a fixed impedance or match at a fixed output swing, or both.

SUMMARY

The following summary is not an extensive overview of all contemplated aspects, and is not intended to identify key or critical elements of all aspects nor delineate the scope of any aspect. Its sole purpose is to present some concepts of one or more aspects in a simplified form as a prelude to the more detailed description that is presented later.

In one embodiment, a regulated output impedance driver can include a driver supply, a pre-driver circuit for generating a driver bias signal based on a swing command, a driver impedance characteristic, and an input signal, and a driver coupled to the driver supply and having a driver output, configured to receive the driver bias signal and generate, in response, at the driver output a driver signal having a swing and an output impedance corresponding to the bias signal.

In an aspect, the driver supply can include a voltage regulator having an input and an output, a supply select switch receiving a first supply rail and a second supply rail and configured to selectively switch, based on the target swing, and a coupling of the voltage regulator input between the first supply rail and the second supply rail.

In another aspect, the pre-driver circuit of one embodiment can include a pre-driver control circuit configured to generate a pre-driver swing control signal based on the swing command and the driver impedance characteristic, and a pre-driver configured to generate the driver bias signal based on the input signal and the pre-driver swing control signal.

In another aspect, the driver in a regulated output impedance driver according to one embodiment can include a voltage-controlled resistor element associated with the driver impedance characteristic and the pre-driver control circuit includes a replica of the voltage controlled resistor element.

In a further aspect, the pre-driver control circuit in a regulated output impedance driver according to one embodiment can include a reference resistor, a reference resistor current source configured to set a reference current through the reference resistor that establishes a voltage on the reference resistor corresponding to the swing command, and a bias voltage detector configured to identify a reference bias voltage that when applied to the replica voltage controlled resistor element establishes a voltage on a current input of the replica voltage controlled resistor element corresponding to the voltage established on the reference resistor, and can further include a pre-driver swing control signal generator configured to generate the pre-driver swing control signal based on the reference bias voltage.

In another aspect, in a regulated output impedance driver according to or embodiment, a bias voltage detector can include a replica reference current source controllable by a voltage established on the reference resistor, configured to pass a current through the replica voltage controlled resistor element, in combination with a comparator that varies the reference bias voltage on the replica voltage controlled resistor element to establish the voltage on its current input.

In an aspect, in a regulated output impedance driver according to one embodiment, a pre-driver control circuit can further include a driver mid-point offset generator configured to generate a driver mid-point offset signal based on the reference bias voltage.

In a further aspect, a driver mid-point offset generator in a regulated output impedance driver according to one embodiment can be configured to generate the driver mid-point offset signal at level of one-half the reference bias voltage.

In another aspect, in a regulated output impedance driver according to one embodiment, the driver can include a circuit leg comprising a switched pull-up element switchably coupling the driver output to the driver supply and a switched pull-down element switchably coupling the driver output to a ground reference, and the switched pull-up element can include a voltage controlled pull-up resistor element in series with a pull-up resistor and, in a further aspect, the switched pull-down element can include a voltage controlled pull-down resistor element in series with a pull down resistor.

In a further aspect, in one regulated output impedance driver according to one embodiment the pre-driver control circuit can include a replica of the circuit leg, having a replica of the switched pull-up element switchably coupling the driver output to the driver supply and a replica of the switched pull-down element switchably coupling the driver output to a ground reference and, in another aspect, the switched pull-up element can include a replica of the voltage controlled pull-up resistor element in series with a replica of the pull-up resistor, and the replica of the switched pull-down element can include a replica of the voltage controlled pull-down resistor element in series with a replica of the pull down resistor.

In another aspect, in one regulated output impedance driver according to one embodiment, the pre-driver control circuit can include a reference resistor, a reference resistor current source configured to establish a reference current through the reference resistor that establishes a voltage on the reference resistor corresponding to the swing command, and a bias voltage detector configured to identify a reference bias voltage that when applied to the replica voltage controlled resistor element establishes a voltage corresponding to the voltage established on the reference resistor, in combination with a pre-driver swing control signal generator configured to generate the pre-driver swing control signal based on the reference bias voltage.

One method in accordance with one embodiment can regulate an output impedance of a driver, and can include generating a driver bias signal based on a swing command, a driver impedance characteristic, a target output impedance information and an input signal, adjusting a swing and an output impedance of a driver based on the driver bias signal, and outputting a driver signal having a swing and a target output impedance based, at least in part, on said adjusting.

In one aspect, one method in accordance with one embodiment can regulate an output impedance of a driver and can include selecting between a first supply rail having a first voltage and a second supply rail having a second voltage different from the first voltage, based at least in part, on the swing command, and regulating a voltage supplied to the driver from the selected one of the first supply rail and second supply rail.

In an aspect, one method in accordance with one embodiment can regulate an output impedance of a driver and can include generating a driver bias signal, establishing a first reference current through reference resistor to establish a voltage on the reference resistor corresponding to the swing command, passing a second reference current, based on the first reference current, through a replica circuit having a voltage controlled resistor element with a voltage-resistance characteristic corresponding to a voltage-resistance characteristic of a driver, adjusting a control voltage to the replica circuit to set the resistance of the replica circuit at a value at which the voltage matches the swing command, and generating the driver bias signal based on the adjusted control voltage.

An apparatus according to one exemplary embodiment can include means for generating a driver bias signal based on a swing command, a driver impedance characteristic, a target output impedance information and an input signal; means for adjusting a swing and an output impedance of a driver based on the driver bias signal; and means for outputting a driver signal having a swing and a target output impedance based, at least in part, on said adjusting.

One method in accordance with one embodiment can regulate an output impedance of a driver, and can include step of generating a driver bias signal based on a swing command, a driver impedance characteristic, a target output impedance information and an input signal, step of adjusting a swing and an output impedance of a driver based on the driver bias signal, and step of outputting a driver signal having a swing and a target output impedance based, at least in part, on said adjusting.

DETAILED DESCRIPTION

Figure 1:
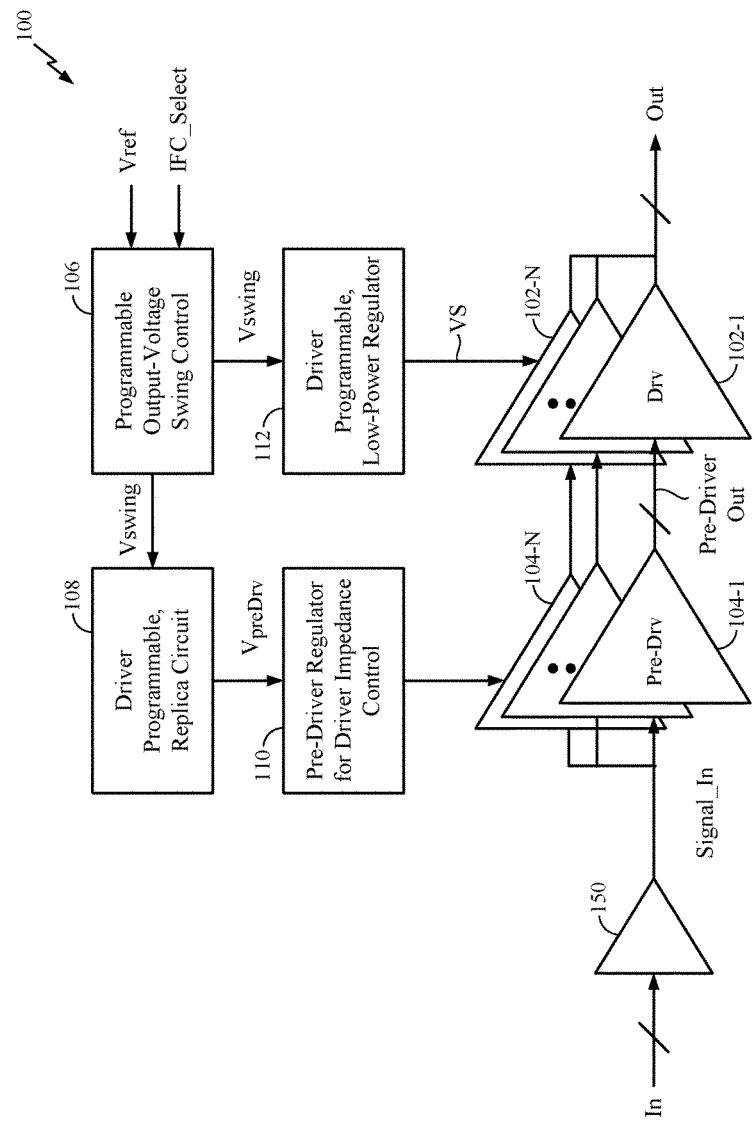
FIG. 1 shows a simplified schematic diagram of one variable swing, constant Output impedance driver in accordance with one exemplary embodiment.

The detailed description set forth below in connection with the appended drawings is intended as a description of exemplary embodiments and is not intended to represent the only embodiments in which the present invention can be practiced. The word "exemplary" (and variants thereof) as used herein means serving as an example, instance, or illustration. Any aspect or design described herein as "exemplary" is not necessarily to be construed as preferred or advantageous over other aspects or designs. Rather, use of the word "exemplary" is only intended to illustrate example applications of concepts using simplified concrete examples.

Various specific details are also described, to facilitate a person of ordinary skill in the art in readily obtaining, through this disclosure in its entirety, a sufficient understanding of relevant concepts to practice according to one or more of the various exemplary embodiments. Such persons, though, upon reading this entire disclosure may see that various embodiments and aspects of one or more embodiments may be practiced without, or with alternatives to one or more of these specific details. In other instances, certain well-known structures and devices are shown in block diagram form to avoid obscuring the various novel ties of the exemplary embodiments.

Various aspects or features will be presented in terms of systems that may include a number of devices, components, modules, and the like. It is to be understood and appreciated that various systems may include additional devices, components, modules, and so forth, and/or may not include all devices, components, modules, and so on, discussed in connection with the figures. A combination of these approaches may also be used.

The terms "engine", "component", "module", "system" and the like, as used herein, are intended to refer to a functional entity, which may be embodied in hardware, firmware, a combination of hardware and software, software, or software in execution. A "component" may be, but is not limited to being, a process running on a processor, a processor, an object, an executable, a thread of execution, a program, and/or a computer. By way of illustration, both an application running on a computing device and the computing device can be a component.

The term "includes," as used in either the detailed description or the claims, is intended to be inclusive in a manner similar to the term "comprising" as "comprising" is interpreted when employed as a transitional word in a claim. The term "or," as used in either the detailed description or the claims, is intended to mean an inclusive "or" rather than an exclusive "or." In addition, the articles "a" and "an" as used in this disclosure should generally be construed to mean "one or more" unless specified otherwise or clear from the context to be directed to a singular form.

Various exemplary embodiments will be described as providing a variable swing, constant output impedance driver. It will be understood that variable swing, constant output impedance drivers according to the exemplary embodiments can maintain a constant output impedance over a swing variable by program command over a given range. The phrase "variable swing, constant output impedance" will be alternatively referenced as "VS/COI driver."

FIG. 1 shows a simplified schematic diagram of one VS/COI driver 100 implemented in accordance with one exemplary embodiment. It will be understood that the FIG. 1 VS/COI driver 100 is only one example VS/COI driver in accordance with an embodiment, and is not intended to limit the scope of devices contemplated by the invention.

Referring to FIG. 1, the VS/COI driver 100 can include a parallel bank of N driver slices, 102-1 . . . 102-N (collectively "driver slices 102," generically "driver slice 102"). In an aspect, each driver slice 102 can be driven by a corresponding one of N pre-driver slices 104-1 . . . 104-N (collectively "pre-driver slices 104"). According to various exemplary embodiments, an "IN" signal may be, but is not necessarily, an amplitude modulated signal. In an aspect the IN signal can be received as a differential signal. In another aspect, the IN signal can be a single-ended signal and converted to a differential signal Signal_IN by, for example, a differential line buffer 150.

According to an embodiment the VS/COI driver 100 can include a programmable swing control 106 configured to generate a "Vswing" control signal that, as described in greater detail at later sections, can control the swing of the pre-driver slices 104. In a further aspect, the programmable swing control 106 can control the pre-driver slices 104 to output Pre-Drive Out at a bias voltage that, applied to the inputs of the driver slices 102, provides automatic control of the driver slice 102 output impedance. Vswing can be generated based, for example, on a command such as the arbitrarily labeled "IFC_Select" that can indicate, or map to a specified output swing for the driver slice 102. Illustrative values of Vswing contemplated by the embodiments are, without limitation, 1.5 volts, 0.5 volts, 0.7 volts, 2.0 volts, or any value spanned by, or outside of these examples. For purposes of convenience, Vswing will be assumed to be in units of volts.

In an aspect the programmable swing control 106 can be configured to generate Vswing based on the IFC_Select and a reference voltage, such as the example arbitrarily labeled as "Vref." FIG. 1 shows Vref as a separate, external input only for purposes of example. In an aspect, Vref may be generated internal to the programmable swing control 106. In one aspect, programmable swing control 106 can include a look-up table or equivalent (not shown in the figures) and using for example a command such as IFC_Select, in combination with Vref can generate Vswing. In another aspect, the IFC_Select may include a direct setting of Vswing, for example as a scaling of Vref. These are only example means for generating Vswing. Various alternative means for generating Vswing, for example, based on IFC_Select (or equivalent) and Vref will become apparent to persons of ordinary skill in the art having view of this disclosure.

In an embodiment, each driver slice 102 can include voltage controlled resistor elements (not shown in FIG. 1) that can be configured to maintain, in response to particularly generated control signal, the output impedance of the driver slice 102. According to one embodiment, the driver slice 102 voltage controlled resistor elements can be field effect transistors (FETs) or equivalent voltage controlled resistor elements, in an aspect, the VS/COI driver 100 can be configured to automatically apply, as described in greater detail later, a bias voltage to the voltage controlled resistor elements of each of the driver slices 102, at the level at which their resistance provides the output impedance of the driver slice 102 to be N times a desired output impedance, termed herein as "R_Spec." The N parallel driver slices 102 therefore, in accordance with exemplary embodiments, can provide a desired R_Spec output impedance over a range of output swing values, illustrative R_Spec values, without limitation, are 25 Ohms, 50 Ohms, 75 Ohms, and 100 Ohms, or any resistance spanned by, greater or less than these examples.

The VS/COI driver 100 in accordance with various exemplary embodiments can include a programmable driver replica circuit 108. The programmable driver replica circuit 108 can be configured to automatically provide, for any R_Spec, the proper bias voltage to the voltage controlled resistor elements of the driver slices 102 such that each driver slice 102 exhibits an output impedance of N times R_Spec (N×R_Spec). In an aspect the programmable driver replica circuit 108 can include a local replica of one or more of the voltage controlled resistor elements of the driver slice 102, and a calibrated resistance element (not separately shown in FIG. 1) having a resistance corresponding to (e.g., equal to, or proportional to) N×R_Spec. In an aspect programmable driver replica circuit 108 can use the calibrated resistance element and its replica of the voltage controlled resistor elements of the driver slice 102 to identify a reference bias voltage that, when applied to its replica voltage controlled resistor element(s), obtains a voltage corresponding to Vswing and an impedance matching N×R_Spec.

Referring still to FIG. 1, in a further aspect the programmable driver replica circuit 108 can be configured to provide the reference bias voltage as VpreDrv voltage to a pre-driver regulator for driver impedance control 110. The pre-driver regulator for driver impedance control 110 can in turn control the pre-driver slices 104 to output differential (not explicitly depicted in FIG. 1) signals Pre-Drive Out to corresponding driver slices 102, with a bias corresponding to the reference bias identified by the programmable driver replica circuit 108.

In practices according to the exemplary embodiments, by changing parameters used by the programmable driver replica circuit 108, for example by changing the command on which it, or other circuitry, generates Vswing, and/or by changing the value (e.g., by switching) of the calibrated resistance element to reflect a different R_Spec, the programmable driver replica circuit 108 can generate a bias voltage by which the pre-driver slices 104 can bias the driver slice 102 to automatically maintain the selected R_Spec over a wide range of Vswing values.

Referring still to FIG. 1, in one embodiment, associated with varying or setting of the VOUT swing of the driver slice 102, the driver slice 102 supply voltage VS can be varied. In an aspect, the driver programmable switchable supply rail power regulator 112 can include, in providing VS, an automatic switching of an internal voltage regulator (not shown in FIG. 1) to take power from one among multiple power rails. In one example, selection can be among at least two power rails—a higher voltage, for example "VDDX" rail, and a lower voltage, for example "VDDCX rail." In an aspect, the driver programmable switchable supply rail power regulator 112 can be configured to switch the internal voltage regulator, based on Vswing. As will be appreciated, this aspect can provide, among other features and benefits, a minimizing of power loss in generating the variable supply voltage VS.

Figure 2:
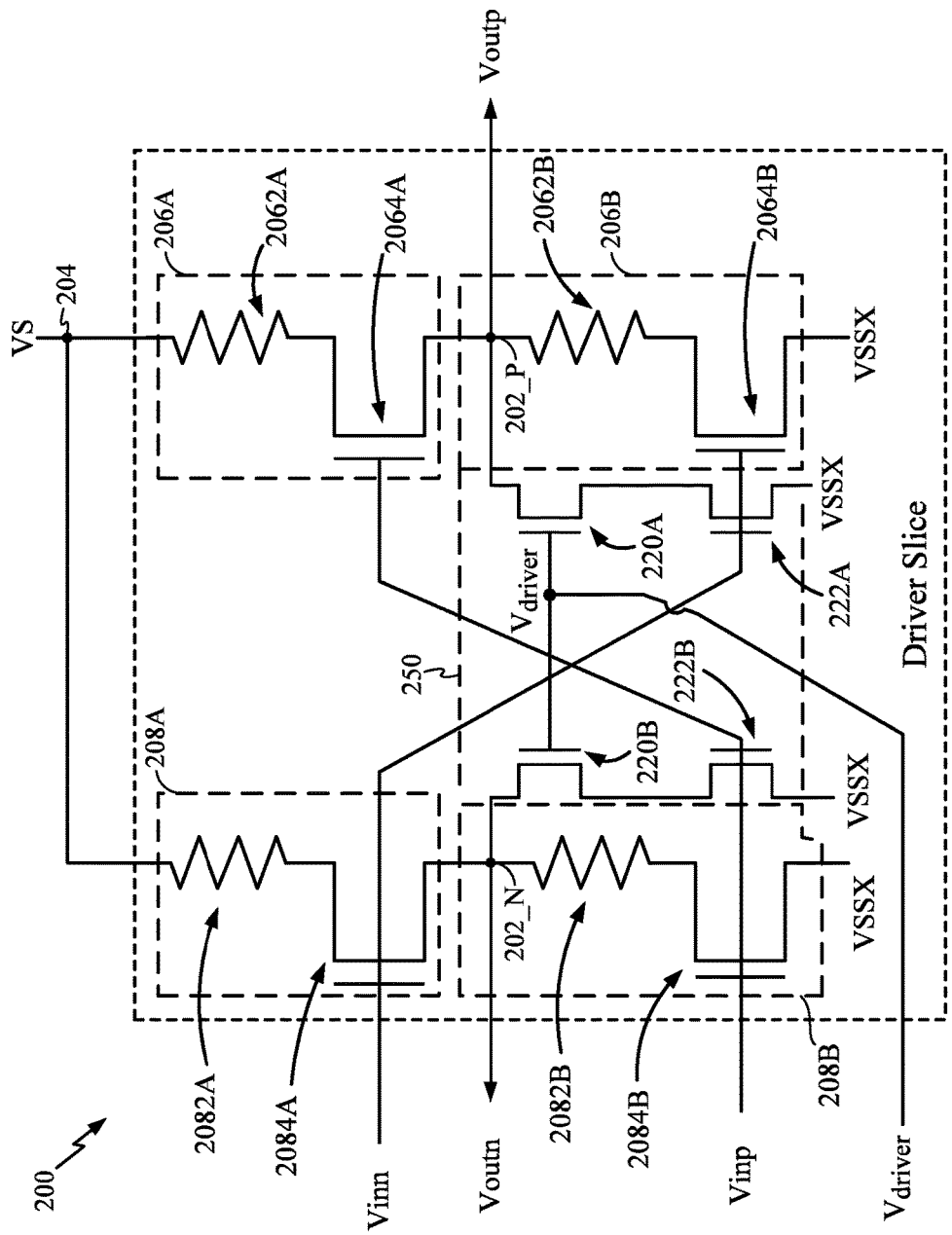
FIG. 2 shows a block schematic of one bias-controlled impedance/variable swing driver slice in accordance with one embodiment.

FIG. 2 shows a block schematic of one bias-controlled impedance, centered variable swing driver slice 200 that, in accordance with one embodiment, can implement the FIG. 1 driver slice 102. It will be understood that FIG. 2 shows only one slice and, as shown at FIG. 1, embodiments can include N of the bias-controlled impedance, centered variable swing driver slice 200 circuits in parallel.

In an aspect the bias-controlled impedance, centered variable swing driver slice 200 can include a VOUT_P node or terminal 202_P, switchably pulled up to a VS supply terminal 204 through a first switchable pull-up unit-resistance element 206A and switchably pulled down to a ground VSSX through a first switchable pull-down unit-resistance element 206B. The first switchable pull-up unit-resistance element 206A can be formed of a first pull-up switch FET 2064A in series with a first pull-up drive resistor 2062A. The first switchable pull-down unit-resistance element 206B can be formed of a first pull-down switch FET 2064B in series with a first pull-down drive resistor 2062B. The term "unit resistance" reflects the resistance of the first switchable pull-up unit-resistance element 206A and the first switchable pull-down unit-resistance element 206B. The ohm value of the unit resistance is, for the first switchable pull-up unit-resistance, the resistance of the first pull-up drive resistor 2062A in series with the ON resistance of the first pull-up switch FET 2064A. It will be understood that the first pull-up switch FET 2064A (and the first pull-down switch FET 2064B) are, in accordance with general FET operation, voltage controlled resistance elements. As will be described in greater detail at later sections, an aspect generates and applies a bias to the gate (shown but not separately labeled) of the first pull-up switch FET 2064A and the gate of the first pull-down switch FET 2064B to set their respective operating points where the "ON" resistance maintains the ohm value of the "unit resistance" at a target.

Referring still to FIG. 2, in an aspect the bias-controlled impedance, centered variable swing driver slice 200 can have a complementary VOUT_N node or terminal 202_N switchably pulled up to the VS supply terminal 204 through a second switchable unit-resistance element 208A, and switchably palled down to the ground VSSX through a second switchable pull-down unit-resistance element 208B. The second switchable pull-up unit-resistance element 208A can be formed of a second pull-up switch FET 2082A in series with a second pull-up drive resistor 2084A. The second switchable pull-down unit-resistance element 208B can be formed, for example, of a second pull-down drive resistor 2084B in series with a second pull-down switch FET 2082B. The above-described aspect of generating and applying a bias to the gate of the first pull-up switch FET 2064A and the gate of the first pull-down switch FET 2064B to set their respective operating points where their "ON" resistance maintains the ohm value of the "unit resistance" at a target impedance can, further to the aspect, apply to the second pull-up switch FET 2084A and the second pull-down switch FET 2084B.

In an aspect, the first pull-up drive resistor 2064A, first pull-down drive resistor 2064B, second pull-up drive resistor 2084A, and second pull-down drive resistor 2084B can all have the same resistance, which can be arbitrarily labeled as R_Resistor. As described above, in an aspect a bias voltage can be generated and applied to respective gates of the first pull-up switch FET 2064A, the first pull-down switch FET 2064B, the second pull-up switch FET 2084A and the second pull-down switch FET 2084B to set their respective "ON" resistance where one "unit resistance" is a target impedance. In an aspect the ON resistance of the first pull-up switch FET 2064A, the first pull-down switch FET 2064B, the second pull-up switch FET 2084A and the second pull-down switch FET 2084B can be equal, and this resistance can be termed as "R_FET."

In reference to FIG. 2, in an aspect the gates of the first pull-up switch FET 2064A and the first pull-down switch FET 2064B can be cross-coupled to the gates of the second pull-down switch FET 2082B and the second pull-up switch FET 2082A and coupled, pair-wise, to the respective Vinn and Vinp terminals. In one example, the Vinp and Vinn signals can have two states, an arbitrary one of these states representing a binary "0" and the other representing a binary "1." For purposes of example, Voutn voltage higher than Voutp by a difference (swing) corresponding to Vswing can represent a binary "0," while the reverse state of Voutp higher than Voutn, by the swing corresponding to Vswing, represents a binary "1."

Referring still to FIG. 2, in this example assignment of Vinp, Vinn, Voutp and Voutn with respect to binary "0" and "1" the Voutp binary "0" state can be achieved by Vinn (at a "1" level) switching (by way of the first pull-down switch FET 2064B) the first switchable pull-down unit-resistance element 206B ON, concurrent with Vinp (at a "0" level) switching (by way of the first pull-switch FET 2064A) the first switchable pull-up unit-resistance element 206A OFF. The Voutn binary "0" state can be achieved by Vinn (at a "1" level) switching (by way of the second pull-up switch FET 2084A) the second switchable pull-up unit-resistance element 208A ON, concurrent with Vinp (at a "0" level) switching (by way of the second pull-down switch FET 2084B) the second switchable pull-down unit-resistance element 208B OFF. The Voutp binary "1" state can be achieved by Vinp (at a "1" level) switching the first switchable pull-up unit-resistance element 206A ON, concurrent with Vinn (at "0" level) switching the first switchable pull-down unit-resistance element 206B OFF. The Voutn binary "1" state can be achieved by Vinn (at a "0" level) switching second switchable pull-up unit-resistance element 208A OFF, concurrent with Vinp (at a "1" level) switching the second switchable pull-down unit-resistance element 208B ON.

Referring still to FIG. 2, the output impedance of the Voutp terminal 202_P of the bias-controlled impedance, centered variable swing driver slice 200 in the above-described binary "0" state is one unit resistance, which is provided by the first switchable unit-resistance element 206B being ON. As described above, the R_Resistor of the first pull-down drive resistor 2062B in series with R_FET of the first pull-down switch FET 2064B. The output impedance of the Voutn terminal 202_N in the binary "0" state is, likewise, one unit resistance, namely the impedance R_FET of the second pull-up switch FET 2084A in series with the impedance R_Resistor of the second pull-up drive resistor element 2082A. As readily seen, the one unit resistance output impedance is likewise maintained at the Voutp terminal 202_ and the Voutn terminal 202_N in the binary "1" state.

As described above and as shown by the FIG. 1 example of N parallel bank of driver slices 102-1 . . . 102-N, in an aspect N of the FIG. 2 bias-controlled impedance, centered variable swing driver slices 200 can be arranged in parallel. The aggregate output impedance is the output impedance of one driver slice 102, i.e., one unit resistance, divided by N. As also described above, in an aspect a bias voltage can be generated and applied to respective gates of the first pull-up switch FET 2064A, the first pull-down switch FET 2064B, the second pull-up switch FET 2084A and the second pull-down switch FET 2084B to set their respective "ON" resistance where one unit resistance is a target impedance. Accordingly, in an embodiment controlling this bias can maintain the value of the unit resistance (the sum of R_Resistor and R_FET) at maintained N×R_Spec, regardless of process variations, voltage and temperature (PVT) of R_Resistor and regardless of the swing of VOUT.

As will be understood by persons of ordinary skill in the art from this disclosure, selecting the nominal R_FET, and the range over which R_FET is intended to be varied, can be performed in combination with selecting the relative value, or ratio of the nominal R_FET to R_Resistor. As will be apparent to such persons from this disclosure, in practices according to various exemplary embodiments selecting the range over which R_FET is intended to be varied, and selecting the relative value or ratio of the nominal R_FET to R_Resistor, can have inter-relating considerations. For example, it will become apparent to persons of ordinary skill in the art from this disclosure that the greater the ratio of R_FET to R_Resistor the greater the controllability of the value of the unit resistance. To illustrate by extreme example, R_Resistor can be set to 0 ohms. This will provide a 1:1 correspondence between varying R_FET and varying the unit resistance. On the other hand, setting R_Resistor to zero would also require an R_FET target value identical to the unit resistance, i.e., N×R_Spec. To illustrate, if N=50 and R_Spec=50 ohms, the required R_FET value would be 2500 ohms. As will be understood by persons of ordinary skill in the art from this disclosure, in certain applications such a value of R_FET may be undesirable. As another extreme example, setting R_Resistor to R_FET to have a ratio of, for example, 50:1, may allow a much lower R_FET value, but may also unacceptably limit the effective range over which the bias on Vinn and Vinp can vary the unit resistance. Therefore, in an aspect, to provide a maximum range of adjustment of the actual R_FET, the nominal R_FET can be selected to be in the middle of an anticipated or design range over which the actual R_FET ON is intended to be varied.

Referring still to FIG. 2, it can be readily understood by persons of ordinary skill in the art, from the above examples and from this disclosure in its entirety, that selecting the range over which R_FET is to be varied, and selecting the relative value or ratio of the nominal R_FET and R_Resistor can be application-specific. Such persons will also understand, based on the present disclosure, that the selection can be readily performed without undue experimentation. For illustration, one ratio of R_Resistor to R_FET, in the example context of a target unit resistance of 2500 ohms, can be 4:1, with R_Resistor being 2000 ohms and a nominal (e.g., center) R_FET of 500 ohms. This is only an illustration and is not intended as any limitation on the scope of the embodiments.

With continuing reference to FIG. 2, in accordance with an embodiment the bias-controlled impedance, centered variable swing driver slice 200 can include a VOUT automatic centering circuit 250. In an aspect your automatic centering circuit 250 can, in response to a driver offset bias signal Vdriver generated in accordance with an embodiment, center the differential output signals Voutp and Voutn about a midpoint at, in accordance with the aspect, Vswing/2. Referring to FIG. 1, as described in greater detail at later sections, the programmable driver replica circuit 108 can be configured to generate the driver offset bias signal Vdriver using its calibrated reference resistance, and its local replicas of the voltage controlled resistance elements used in the driver slice 102.

In Referring to FIG. 2, in accordance with an embodiment the VOUT automatic centering circuit 250 can include a first swing-dependent FET 220A in series with a first signal switched shunt FET 222A, with this series arrangement being parallel to the first switched from the VOUT_P node to VSSX. A second swing-dependent FET 220B in series with a second signal switched shunt FET 222B can provide a parallel, or bypass path from the VOUT_N node to VSSX. The gates (shown but not separately numbered) of the first and second swing-dependent FETs 220A and 220B can be driven by the Vdriver signal. In a further aspect, the gate (shown but not separately numbered) of the first signal switched shunt FET 222A can be coupled to the gate (shown but not separately numbered) of the first pull-down switch FET 2064B. Similarly, the gate (shown but not separately numbered) of the second signal switched shunt FET 222B can be coupled to the gate (shown but not separately numbered) of the second pull-down switch FET 2084B.

Referring still to FIG. 2, for convenient reference in describing example operations the series structure first switchable pull-up unit-resistance element 206A and first switchable pull-down unit-resistance element 206B, coupled at the Voutp node or terminal 202_P and extending from the VS terminal 204 to the VSSX reference, can be alternatively referenced as a "driver bias-adjusted impedance leg." The series structure of the second switchable pull-up unit-resistance element 208A and second switchable pull-down unit-resistance element 208B, coupled at the Voutn node or terminal 202_N can be another example driver bias-adjusted impedance leg. Also for convenient reference in describing example operations the first pull-up switch FET 2062A, first pull-down switch FET 2062B, second pull-up switch FET 2082A, and second pull-down switch FET 2082B will be alternatively referenced as, "voltage controlled pull-up resistor elements" and "voltage controlled pull-down resistor elements," respectively.

Figure 3:
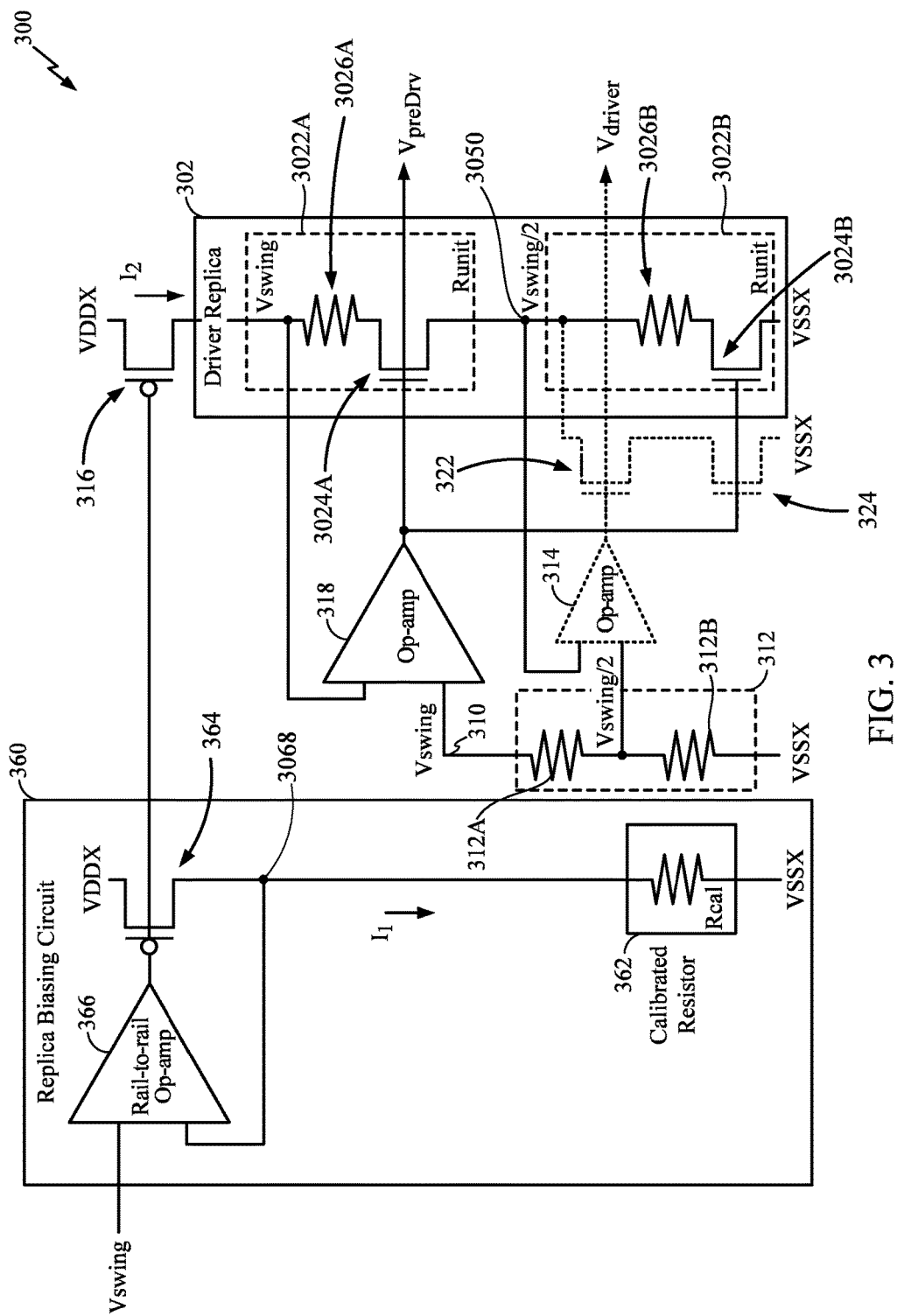
FIG. 3 shows one example programmable driver replica biasing circuit according to an embodiment.

FIG. 3 shows one example programmable driver replica biasing circuit 300 according to an embodiment. The programmable driver replica biasing circuit 300 can be an implementation of the FIG. 1 programmable driver replica circuit 108. Referring to FIG. 3, the programmable driver replica biasing circuit 300 can include a replica driver leg 302. In one aspect, the replica driver leg 302 can be structurally identical to one of the driver bias-adjusted impedance legs of the FIG. 2 driver slice 200 (e.g., the series arrangement of the first switchable pull-up unit-resistance element 206A and first switchable pull-down unit-resistance element 206B, coupled at the Voutp node or terminal 202_P and extending from the VS supply terminal 204 to the VSSX reference). It will be understood that "structurally identical" can encompass structures nominally identical in shape, dimension, arrangement and material(s), but differing according to fabrication tolerances, as well as having differences in shape, dimension, arrangement and material(s) forms but that exhibit substantially identical voltage-current characteristics, at least over an intended range of operation.

With continuing reference to FIG. 3, according to one aspect the replica driver leg 302 can include a pull-up or first switched unit resistance circuit 3022A, which can be formed of a pull-up FET 3024A in series with a pull-up resistor 3026A, coupled in series with a pull-down or second switched unit resistance circuit 3022B, formed of a pull-down FET 3024B in series with pull-down resistor 3026B. According to various aspects the pull-up FET 3024A and pull-down FET 3024B operate as voltage controlled resistance elements and, therefore, are alternatively referenced as "voltage controlled pull-up resistance element" 3024A, and "voltage controlled pull-down resistance element" 3024B, respectively. The midpoint coupling of the pull-up switched unit resistance circuit 3022A to the pull-down switched unit resistance circuit 3022B can form a Vswing/2 node 3050. In an aspect, the pull-up resistor 3026A of the pull-up switched unit resistance circuit 3022A and the pull-down resistor 3026B of the pull-up switched unit resistance circuit 3022A can be configured to have the previously described resistance R_Resistor.

Referring still to FIG. 3, the term "unit resistance" will be understood to have the same meaning in the context of the replica driver leg 302 pull-up switched unit resistance circuit 3022A and pull-down switched unit resistance circuit 3022B as described in the context of the driver bias-adjusted impedance legs of the FIG. 2 driver slice 200, in other words N×R_Spec.

In an aspect, Vswing, generated for example as described above by the FIG. 1 programmable output-voltage swing control 106, can be received at a top node 310 of a voltage divider 312. The voltage divider 312 can be formed by, for example, a first segment resistor 312A in series with a second segment resistor 312B. According to one aspect, the voltage divider 312 can be a ½ divider and, further to this ½ divider aspect, the first segment resistor 312A can have identical resistance (within an application-specific tolerance readily identified by persons of ordinary skill having view of this disclosure) to the second segment resistor 312B. In a related aspect, the ½ take-off node 312C of the voltage divider can generate a Vswing/2 reference voltage. In another aspect, a first operational amplifier (op-amp) 311 can receive, at one of its compare inputs (shown but not separately numbered) the Vswing/2 reference voltage from the ½ take-off node 312C and, at the other of its compare inputs (shown but not separately numbered) the voltage at the Vswing/2 node 3050. Therefore, farther to this aspect, programmable driver replica biasing circuit 300 forces Vswing/2 node 3050 to the voltage Vswing/2, as described in greater detail below.

Referring still to FIG. 3, in an aspect the Vswing voltage received at the top node 310 of the voltage divider 312 can also be coupled to one of two difference inputs (shown but not separately numbered) of a second operational amplifier (op-amp) 318, and the other difference node (shown but not separately numbered) of the second op-amp 318 coupled to the top node 302A of the replica driver leg 302. In an aspect, the top node 302A of the replica driver leg 302 can also receive a reference current I2 through a replica driver leg current supply FET 316. In an aspect, the output of the second op-amp 318 can control the voltage controlled pull-up resistance element 3021A of the pull-up switched unit resistance circuit 3022A and, concurrently, the voltage controlled pull-down resistance element 3024B of the pull-down switched unit resistance circuit 3022B. It can be seen that due to the first op-amp 314 maintaining the voltage at the node 3050 at Vswing/2, the bias that the second op-amp 318 establishes on the gate shown but not separately numbered of the voltage controlled pull-down resistance element 3024B will be substantially identical to the bias it establishes on the gate (shown but not separately numbered) of the voltage controlled pull-up resistance element 3024A. In an aspect, a FET (or combination of FETs) forming the voltage controlled pull-down resistance element 3024B can be configured with structure substantially identical to a FET (or combination of FETs) forming the voltage controlled pull-up resistance element 3024A. Therefore, it will be understood that further to this aspect the second op-amp 318 can control the ON resistance of the voltage controlled pull-up resistance element 3024A, and the ON resistance of the voltage controlled pull-down resistance element 3024B, in substantially locked step.

With continuing reference to FIG. 3, in an aspect the replica driver leg current supply FET 316 can be controlled by a replica biasing circuit 360, as described in greater detail below, to generate the reference current I2. As will be understood the reference current I2 can be generated at the value that will establish the Vswing voltage on the top node 302A of the replica driver leg 302 when the series resistance of its pull-up switched unit resistance circuit 3022A and pull-down switched unit resistance circuit 3022B is equal to twice the target resistance of N×R_Spec. Further to this aspect, the replica driver leg current supply FET 316 can be configured as a current mirror, outputting I2 substantially fixed at the required value—even as the second op-amp 318 varies the ON resistance of the voltage controlled pull-up resistance element 3024A and the voltage controlled pull-down resistance element 3024B. Configured according to this aspect, when the second op-amp 318 establishes the ON resistance of the voltage controlled pull-up resistance element 3024A and, as previously described, the identical ON resistance of the voltage controlled pull-down resistance element 3024B at the value at which the voltage at the top node 302A of the replica driver leg 302 is at Vswing, the resistance of replica driver leg 302 is equal to twice the target resistance of N×R_Spec. As described above, the pull-up resistor 3026A and pull-down resistor 3026B can each have the resistance R_Resistor. Therefore, as will be apparent to persons of ordinary skill in the art from this disclosure, when the resistance of replica driver leg 302 is equal to twice the target resistance of N×R_Spec, the ON resistance of the voltage controlled pull-up resistance element 3024A and the ON resistance of the voltage controlled pull-down resistance element 3024B are both at the value of R_FET at which the voltage controlled resistor elements of the driver bias-adjusted impedance legs of the FIG. 2 driver slice 200 the first pull-up switch FET 2064A and first pull-down switch FET 2064B) will be when the driver bias-adjusted impedance legs have this same impedance.

Referring still to FIG. 3, control by the replica biasing circuit 360 of the replica driver leg current supply FET 316 to operate as a current mirror and feed the proper value of the reference current I2 through the replica driver leg 302 will now be described. In an aspect the replica biasing circuit 360 can include a calibrated resistor 362 having a calibrated, resistance value Real of (4×R_Spec×N), where, as described above, N is the number of driver slices and R_Spec is the desired impedance. In accordance with various exemplary embodiments, the calibrated resistor 362 value can be calibrated against a known accuracy off-chip resistor (not shown). With respect to techniques for performing the calibration, in an aspect this can be performed by, for example, applying conventional general techniques, known to persons of ordinary skill in the semiconductor integrated circuit arts, for calibrating a resistor element using an off-chip reference resistance, to the present disclosure and, therefore, further detailed description is omitted.

Continuing to refer to FIG. 3, in an aspect, the replica biasing circuit 360 can include a second reference current FET 364, coupled to the VDDX supply and controlled by a third rail-to-rail op-amp 366 receiving Vswing and, in a feedback manner, the voltage established at node 3068, to supply the reference current I1 through the calibrated resistor 362. As will be readily understood, since the Real of the calibrated resistor 362 is 4 times the unit resistance value (e.g., 4 times N×R_Spec), the reference current I1 will be ¼ the current that, passing through a bias-adjusted impedance leg of the bias-controlled impedance, centered variable swing driver slice 200, will establish Vswing. As previously described, in an aspect the impedance of the replica driver leg 302, when its pull-up and pull-down switched unit resistance circuits 3022A and 3022B are biased by the second op-amp 318 to establish Vswing at the top node 302A, will be twice the unit resistance, i.e., ½ Real. Therefore, according to this aspect, the reference current I2 can be twice the reference current I1. Further to this aspect, the replica driver leg current supply FET 316 can be configured as a current mirror to generate, based on the voltage generated by the third rail-to-rail op-amp 366 in setting the current through the second reference current FET 364, the reference current I2 at 2×I1.

Referring to FIG. 3, in an aspect the output of the second op-amp 318 that established the reference bias on the voltage controlled pull-up resistance element 3024A and voltage controlled pull-down resistance element 3024B can be output as VpreDrv, which can be received by the pre-driver slices (e.g., the FIG. 1 pre-driver slices 104) by which, as described in detail at later sections, the pre-driver slices set the bias of their respective outputs Vinn and Vinp to their corresponding driver slices (e.g., the driver slices 102). In a further aspect the output of the first op-amp 314, which set the mid-point setting leg first switch FET 322 at a bias that, in combination with the mid-point setting leg second FET 324, set the voltage at the node 3050 to Vswing/2, is output as Vdriver voltage. The mid-point setting leg second FET 324 is biased by the same voltage the second op-amp 318 applied to voltage controlled pull-up resistance element 3024A and voltage controlled pull-down resistance element 3024B. As described in reference to FIG. 2, the Vdriver voltage can be used, for example by the automatic center circuit 250, to bias the swing of the Voutn and Voutp about a midpoint at Vswing/2.

Figure 4:
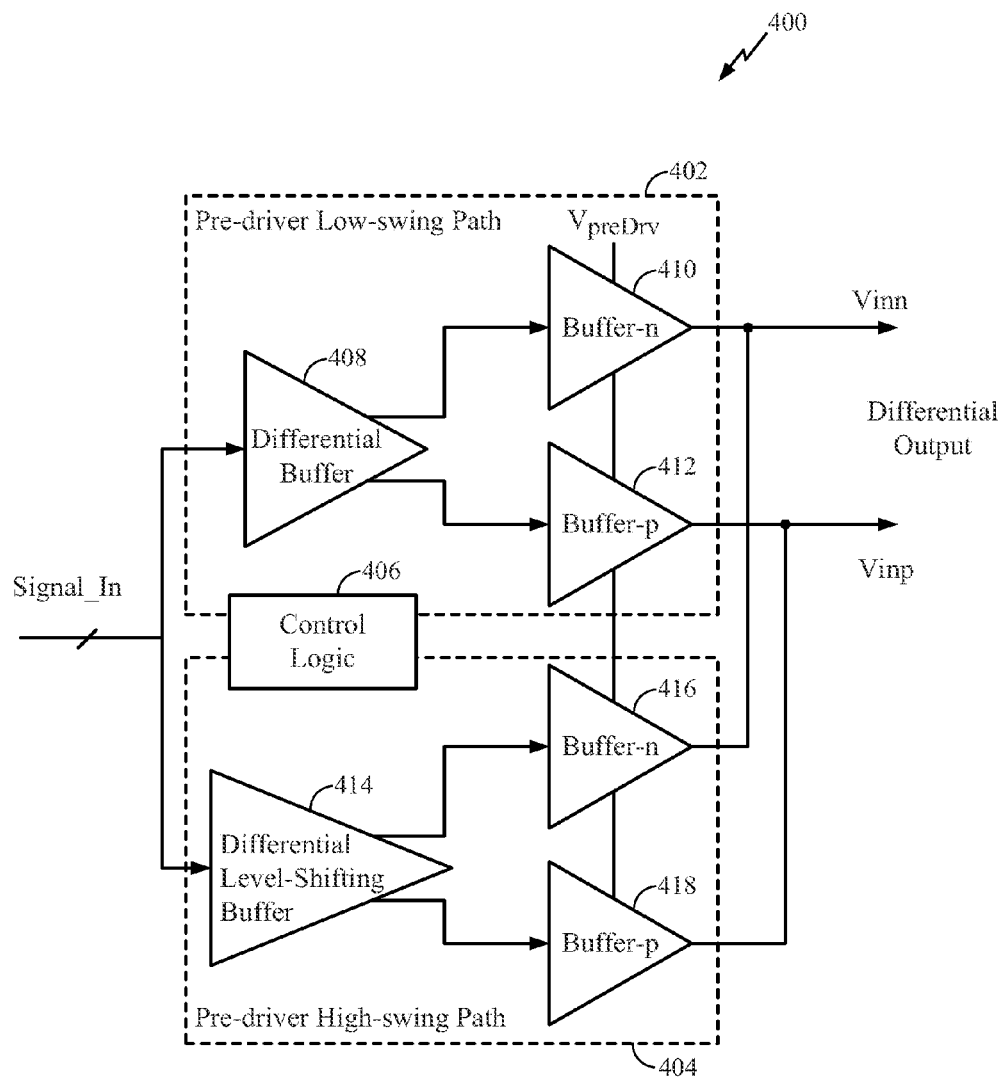
FIG. 4 shows a simplified schematic diagram of one dual-path pre-driver slice in accordance with an embodiment.

FIG. 4 shows a simplified schematic diagram of one dual-path pre-driver slice 400 in accordance with an embodiment. The dual-path pre-driver slice 400 can be one FIG. 1 pre-driver slice 104. An example supply voltage for the FIG. 4 dual-path pre-driver slice 400 can be the FIG. 1 pre-driver regulator 110. Referring to FIG. 4, one dual-path pre-driver slice 400 can, in one aspect, include a low-swing pre-driver path 402, a parallel high-swing pre-driver path 404, and a control logic 406 that can receive an instruction (not explicitly shown in FIG. 4) corresponding to Vswing (e.g., the Vswing signal itself) and, based on this, enable or select the low-swing pre-driver path 402 when Vswing is below a given threshold and enable or select the high-swing pre-driver path 404 when Vswing is above (or equal to) the given threshold. In one aspect, the low-swing pre-driver path 402 can include a low-swing differential buffer 408 generating a single ended "n" signal (shown but not separately labeled) that a low-swing level pre-drive output buffer-n 410 outputs to the Vinn out, and generating a single ended "p" signal (shown but not separately labeled) that a low-swing level pre-drive output buffer-p 412 outputs to the Vinp out.

Referring still to FIG. 4, in an aspect, the high-swing pre-driver path 404 can include a high swing differential, level-shifting buffer 414 generating a single ended high swing, level shifted "n" signal (shown but not separately labeled) that a high-swing level pre-drive output buffer-n 416 outputs to the Vinn, and generating a single ended, high swing, level-shifted "p" signal (shown but not separately labeled) that a high-swing level pre-drive output buffer-p 418 outputs to the Vinp out. In an aspect, the level-shifting applied by the high-swing pre-driver path 404 can correspond to the VpreDry signal generated by the FIG. 3 programmable driver replica biasing circuit 300, setting the Vinn and Vinp signals at a bias at which the ON resistance of the switch FETS of the driver slices (e.g., the FIG. 2 first and second pull-up switch FETs 2064A and 2084A, and first and second pull-down switch FETs 2064B and 2084B) will cause Voutn and Voutp to have Vswing and an output impedance of N×R_Spec.

Figure 5:
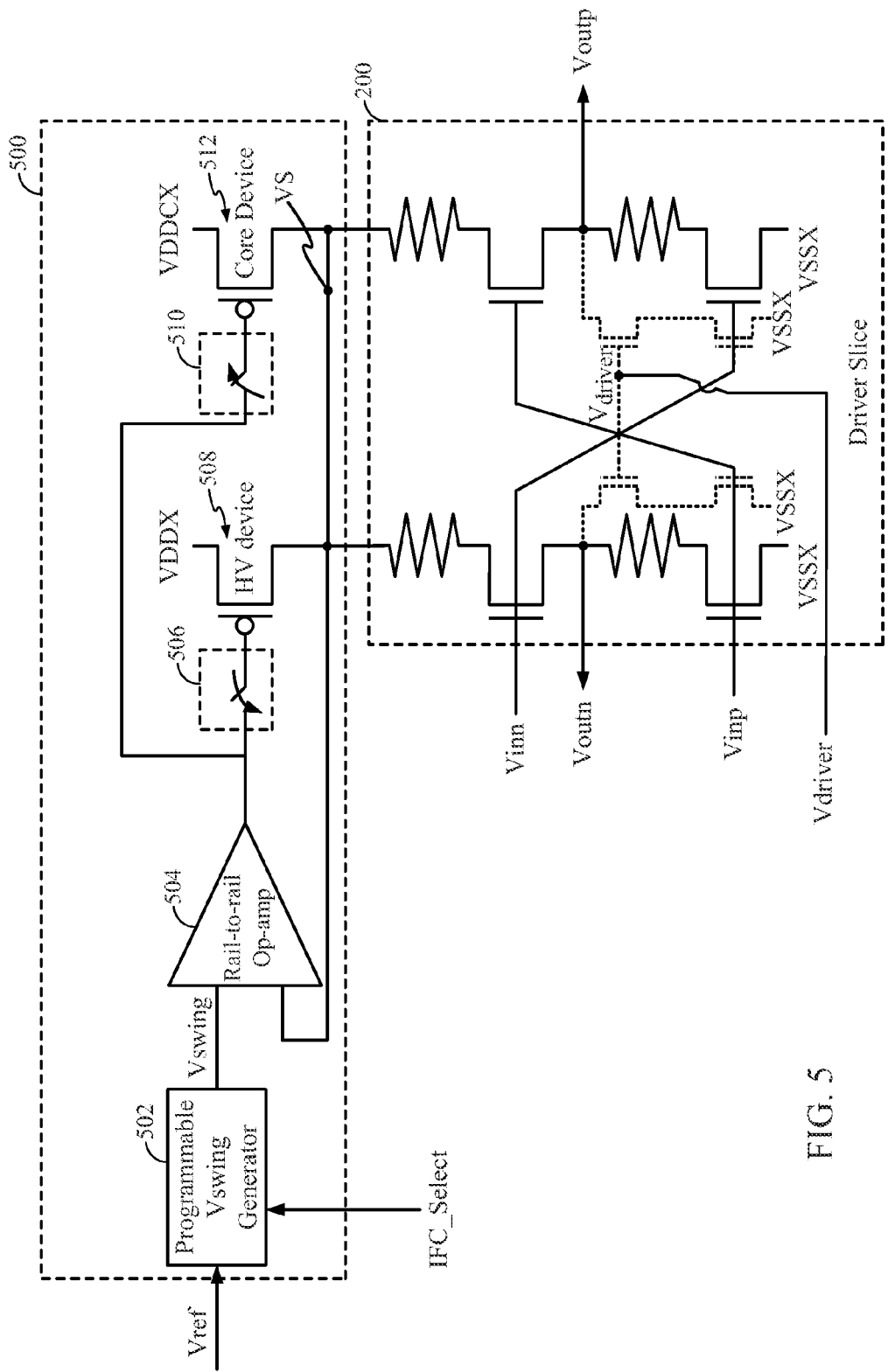
FIG. 5 shows a simplified schematic of one example swing adapted/switchable supply rail regulator in accordance with an embodiment.

FIG. 5 shows a simplified schematic of one example swing adapted/switchable supply rail regulator 500 in accordance with an embodiment, in combination with the FIG. 2 bias-controlled impedance, centered variable swing driver slice 200. Referring to FIG. 5, the swing adapted/switchable supply rail regulator 500 can include, in accordance with one aspect, a programmable swing generator 502 that can also serve as FIG. 1 the programmable swing control 106. In an aspect, the programmable swing generator 502 can generate Vswing using a swing information indicated by, for example, IFC_Select or equivalent, in combination with Vref. A regulator 504, which can be a rail-to-rail difference op-amp, can regulate a supply voltage VS to the driver slice 200 from one or both of the VDDX supply and/or the VDDCX supply. Selection between the VDDX supply and the VDDCX supply can be provided by the VDDX enabling switch 506 and the VDDCX enabling switch 510. In an aspect, selecting which of the VDDX enabling switch 506 and the VDDCX enabling switch is ON can switch to the lower of the VDDX supply and the VDDCX supply that is slightly higher than the desired output swing. For example, if Vswing is 1.2 V-diff, then the lowest between the VDDX supply and the VDDCX supply that is higher than 1.2 V by a delta of perhaps 100 mV can be selected. It will be understood that if only one of the VDDX supply and the VDDCX supply is, in this example, more than 100 mV greater than 1.2 V then that one will be selected. To select the VDDX supply and not the VDDCX supply, the VDDX enabling switch 506 is ON, and the VDDCX enabling switch 510 is OFF. The regulator 504 then controls the voltage VS by controlling the gate of the VDDX supply FET 508. To select the VDDCX supply and not the VDDX supply, the VDDCX enabling switch 510 is ON, and the VDDX enabling switch 506 is OFF. The regulator 504 then controls the voltage VS by controlling the gate of the VDDCX supply FET 512. It will be understood that the VDDX and VDDCX supplies in the FIG. 5 example swing adapted/switchable supply rail regulator 500 are not intended to limit the embodiments to two supplies. For example, an additional supply (not shown) can be included by simply adding another supply FET between the VS node and the additional supply, with another enabling switch coupling the output of the regulator 504 to the gate of the added supply FET.

As will be appreciated, the swing adapted/switchable supply rail regulator 500 can reduce or minimize power wasted by the internal low power voltage regulator in dropping that selected source (e.g., VDDX or VDDCX) voltage to the regulated VS.

As will be appreciated, among features provided by the exemplary embodiments is that N driver slices (e.g. N FIG. 1 driver slices 102, or N of the example FIG. 2 bias-controlled impedance, centered variable swing driver slices 200) can automatically match to a given impedance line impedance R_Spec, for example 50 ohms, 75 ohms, 40 ohms or any other value. In an aspect, the driver slices include constant value resistors, for example the FIG. 2 first and second pull-up and pull-down driver resistors 2062A, 2062B, 2082A and 2082B having, for example ⅘ of N×R_Spec, can insure that the output impedance of the N parallel driver slices remains close to R_Spec. In a further aspect, the voltage controlled resistors of the driver slices can provide a fraction, for example, but not limited to, ⅕ of the N×R_Spec resistance and, in accordance with various exemplary embodiments, can be automatically adjusted to maintain the desired impedance for each slice at N×R_Spec, for a total impedance of R_Spec, even over large voltage swings. In accordance with various exemplary embodiments, a still further feature can be ESD protection and ballast provided by the fixed resistances of the driver slices.

Figure 6:
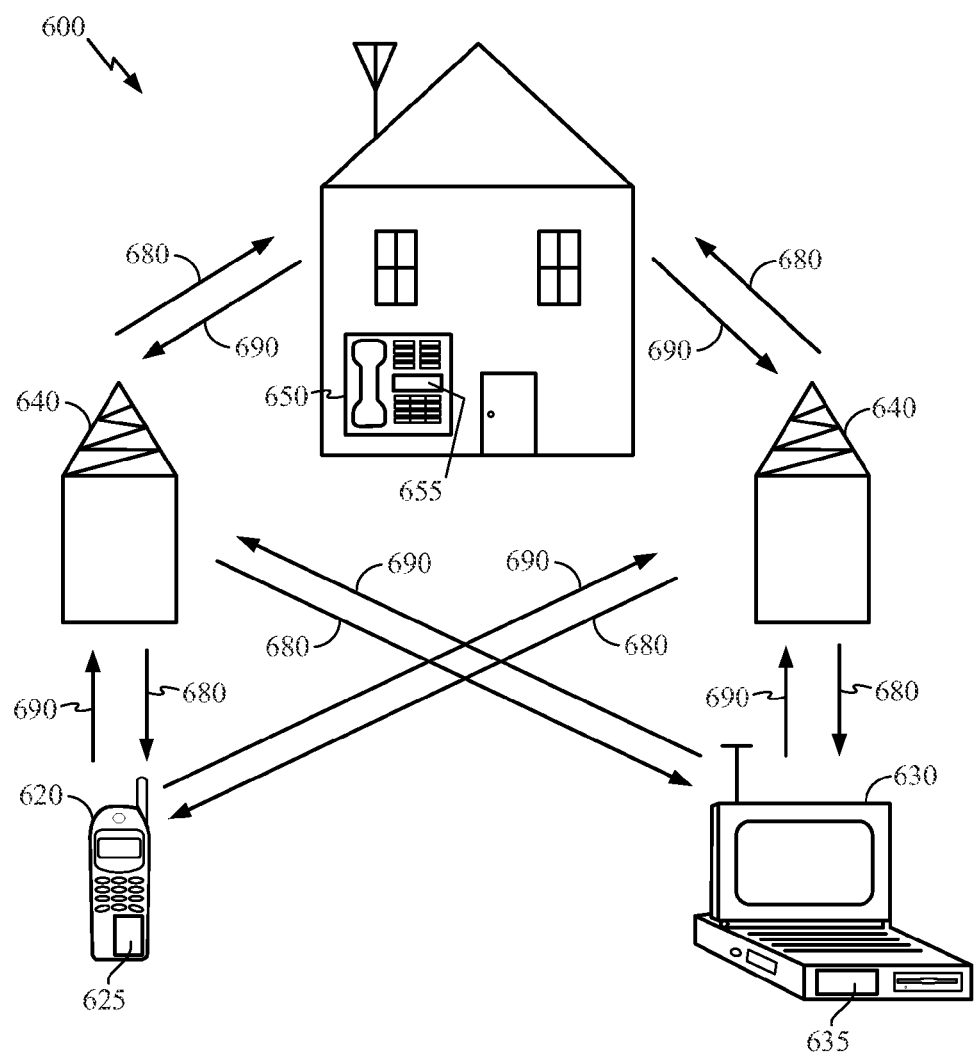
FIG. 6 illustrates an exemplary wireless communication system in which one or more embodiments of the disclosure may be advantageously employed.

FIG. 6 illustrates an exemplary wireless communication system 600 in which one or more embodiments of the disclosure may be advantageously employed. For purposes of illustration, FIG. 6 shows three remote units 620, 630, and 650 and two base stations 640. It will be recognized that conventional wireless communication systems may have many more remote units and base stations. The remote units 620, 630, and 650 include semiconductor devices 625, 635 and 655 (including on-chip voltage regulators, as disclosed herein), which are among embodiments of the disclosure as discussed further below. FIG. 6 shows forward link signals 680 from the base stations 640 and the remote units 620, 630, and 650 and reverse link signals 690 from the remote units 620, 630, and 650 to the base stations 640.

In FIG. 6, the remote unit 620 is shown as a mobile telephone, the remote unit 630 is shown as a portable computer, and the remote unit 650 is shown as a fixed location remote unit in a wireless local loop system. For example, the remote unit may be one or more of a mobile phone, hand-held personal communication systems (PCS) unit, portable data units such as a personal data assistant, navigation devices (such as GPS enabled devices), set top box, music player, video player, entertainment unit, fixed location data unit such as a meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device that includes at least one semiconductor die having active integrated circuitry including memory and on-chip circuitry for test and characterization.

In view of exemplary systems shown and described above, methodologies that may be implemented in accordance with the disclosed subject matter, will be better appreciated with reference to various flow charts. While, for purposes of simplicity of explanation, methodologies are shown and described as a series of blocks, it is to be understood and appreciated that the claimed subject matter is not limited by the number or order of blocks, as some blocks may occur in different orders and/or as substantially the same time with other blocks from what is depicted and described herein. Moreover, not all illustrated blocks may be required to implement methodologies described herein. It is to be appreciated that functionality associated with blocks may be implemented by software, hardware, a combination thereof or any other suitable means (e.g. device, system, process, or component). Additionally, it should be further appreciated that methodologies disclosed, throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram. Further, the various methods disclosed herein can include employing a processor executing computer executable instructions stored on a computer readable storage medium to implement the methods.

It will be appreciated that data store (e.g., memories) components described herein may include or may be implemented using volatile memory, nonvolatile memory, or both. Nonvolatile memory may include or may be implemented with any non-volatile memory technology capable of meeting performance requirements pertaining to the particular memory function implemented, which can be readily ascertained by persons of ordinary skill in the art upon reading this disclosure, and may include, as illustrative but imitative examples, read only memory (RUM), programmable ROM (PROM), electrically programmable ROM (EPROM), electrically erasable ROM (EEPROM), or flash memory. Volatile memory may include or may be implemented with any volatile memory technology capable of meeting performance requirements pertaining to the particular memory function implemented, which can be readily ascertained by persons of ordinary skill in the art upon reading this disclosure, and may include, as illustrative but limitative examples, synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the various aspects is intended to comprise, without being limited to, these and any other suitable types of memory.

It is to be understood that aspects described herein may be implemented by hardware, software, firmware or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. In addition, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the steps and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the steps and/or actions of a method or algorithm may reside as one or any combination or set of codes and/or instructions on a machine-readable medium and/or computer readable medium, which may be incorporated into a computer program product.

While the foregoing disclosure discusses illustrative aspects and/or embodiments, it should be noted that various changes and modifications could be made herein without departing from the scope of described aspects and/or embodiments as defined by the appended claims. Accordingly, described aspects are intended to embrace all such alterations, modifications and variations that fall within scope of appended claims. Furthermore, although elements of described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A regulated output impedance driver, comprising:
   a driver supply;
   a plurality of pre-driver slices each configured to generate a driver bias signal based at least in part on a swing command, a driver impedance characteristic, and an input signal; and
   a plurality of driver slices each coupled to the driver supply and each having a driver output, the plurality of drivers slices each being configured to receive the driver bias signal and generate, in response, at the driver output a driver signal having a swing and an output impedance corresponding to the driver bias signal,
   the pre-driver circuit being configured to automatically adjust the driver bias signal such that the output impedance at the driver output is varied to match an impedance of a given line; and further comprising:
   a programmable swing control circuit configured to generate a swing control signal;
   the plurality of pre-driver slices, each pre-driver slice being configured to output a driver bias
   signal based on the swing control signal; and
   the plurality of driver slices connected in parallel with commonly connected outputs, each
   driver slice being configured to output a driver signal based on the driver bias signal from a corresponding pre-driver slice,
   the programmable swing control circuit being configured to control the plurality of pre-driver slices to output the driver bias signals to automatically control output impedances of the plurality of driver slices, and each driver slice being capable of outputting a pull-up driver signal and a pull-down driver signal; and the output impedance of each driver slice being controlled such that an aggregate output impedance of the plurality of driver slices is a desired output impedance R_Spec, the aggregate output impedance being an impedance of parallel connected outputs of the plurality of driver slices.

2. The regulated output impedance driver of claim 1, the driver supply comprising:
   a voltage regulator having an input and an output; and
   a supply select switch receiving a first supply rail and a second supply rail and configured to selectively switch, based on a target swing, a coupling of the voltage regulator input between the first supply rail and the second supply rail.

3. The regulated output impedance driver of claim 1, the pre-driver circuit comprising:
   a pre-driver control circuit configured to generate a pre-driver swing control signal based at least in part on the swing command and the driver impedance characteristic; and
   a pre-driver configured to generate the driver bias signal based at least in part on the input signal and the pre-driver swing control signal.

4. The regulated output impedance driver of claim 3,
   the driver comprising a voltage-controlled resistor element associated with the driver impedance characteristic,
   the pre-driver control circuit comprising a replica of the voltage-controlled resistor element, and the pre-driver control circuit being configured to generate the driver bias signal further based on the replica of the voltage-controlled resistor element.

5. The regulated output impedance driver of claim 4, the pre-driver control circuit comprising:
   a reference resistor;
   a reference resistor current source configured to set a reference current through the reference resistor that establishes a voltage on the reference resistor corresponding to the swing command;
   a bias voltage detector configured to identify a reference bias voltage that when applied to the replica of the voltage-controlled resistor element establishes a voltage on a current input of the replica of the voltage-controlled resistor element corresponding to the voltage established on the reference resistor; and
   a pre-driver swing control signal generator configured to generate the pre-driver swing control signal based at least in part on the reference bias voltage.

6. The regulated output impedance driver of claim 5, the bias voltage detector comprising:
   a replica reference current source controllable by the voltage established on the reference resistor, configured to pass a current through the replica of the voltage-controlled resistor element; and
   a comparator that varies the reference bias voltage on the replica of the voltage-controlled resistor element to establish said voltage on the current input.

7. The regulated output impedance driver of claim 5, the pre-driver control circuit further comprising a driver mid-point offset generator configured to generate a driver mid-point offset signal based at least in part on the reference bias voltage.

8. The regulated output impedance driver of claim 7, the driver mid-point offset generator being configured to generate the driver mid-point offset signal at a level of one-half the reference bias voltage.

9. The regulated output impedance driver of claim 1,
   the pre-driver circuit comprising a pre-driver control circuit configured to generate a pre-driver swing control signal based at least in part on a swing command and the driver impedance characteristic, and a pre-driver configured to generate the driver bias signal based at least in part on the input signal and the pre-driver swing control signal,
   the driver comprising a circuit leg comprising a switched pull-up element switchably coupling the driver output to the driver supply and a switched pull-down element switchably coupling the driver output to a ground reference,
   the switched pull-up element comprising a voltage controlled pull-up resistor element in series with a pull-up resistor, and the switched pull-down element comprising a voltage controlled pull-down resistor element in series with a pull down resistor,
   the pre-driver control circuit comprising a replica of the circuit leg; having a replica of the switched pull-up element switchably coupling the driver output to the driver supply and a replica of the switched pull-down element switchably coupling the driver output to a ground reference, and
   the replica of the switched pull-up element comprising a replica of the voltage controlled pull-up resistor element in series with a replica of the pull-up resistor, and the replica of the switched pull-down element comprising a replica of the voltage controlled pull-down resistor element in series with a replica of the pull down resistor.

10. The regulated output impedance driver of claim 9, the pre-driver control circuit comprising:
    a reference resistor;
    a reference resistor current source configured to establish a reference current through the reference resistor that establishes a voltage on the reference resistor corresponding to the swing command;
    a bias voltage detector configured to identify a reference bias voltage that when applied to the replica of the voltage controlled resistor element establishes a voltage corresponding to the voltage established on the reference resistor; and
    a pre-driver swing control signal generator configured to generate a pre-driver swing control signal based at least in part on the reference bias voltage.

11. The regulated output impedance driver of claim 1, the regulated output impedance driver being integrated in at least one semiconductor die.

12. The regulated output impedance driver of claim 1, further comprising a device, selected from the group consisting of a set top box, music player, video player, entertainment unit, navigation device, communications device, personal digital assistant (PDA), fixed location data unit, and a computer, into which the regulated output impedance driver is integrated.

13. A method for regulating output impedance of a driver, the method comprising:
    generating a driver bias signal based on a swing command, a driver impedance characteristic, and an input signal;
    adjusting a swing and an output impedance of a driver based at least in part on the driver bias signal; and
    outputting a driver signal having the swing and the output impedance based, at least in part, on said adjusting, the driver bias signal being automatically adjusted such that the output impedance of the driver is varied to match an impedance of a given line; and further comprising:
    a programmable swing control circuit configured to generate a swing control signal;
    a plurality of pre-driver slices, each pre-driver slice being configured to output a driver bias
    signal based on the swing control signal; and
    a plurality of driver slices connected in parallel with commonly connected outputs, each
    driver slice being configured to output a driver signal based on the driver bias signal from a corresponding pre-driver slice,
    the programmable swing control circuit being configured to control the plurality of pre-driver slices to output the driver bias signals to automatically control output impedances of the plurality of driver slices, and each driver slice being capable of outputting a pull-up driver signal and a pull-down driver signal; and the output impedance of each driver slice being controlled such that an aggregate output impedance of the plurality of driver slices is a desired output impedance R_Spec, the aggregate output impedance being an impedance of parallel connected outputs of the plurality of driver slices.

14. The method of claim 13, further comprising:
selecting between a first supply rail having a first voltage and a second supply rail having a second voltage different from the first voltage, based at least in part, on the swing command; and
regulating a voltage supplied to the driver from the selected one of the first supply rail and the second supply rail.

15. The method of claim 13, generating the driver bias signal comprises:
establishing a first reference current through a reference resistor to establish a voltage on the reference resistor corresponding to the swing command;
passing a second reference current, based at least in part on the first reference current, through a replica circuit having a voltage controlled resistor element with a voltage-resistance characteristic corresponding to a voltage-resistance characteristic of the driver;
adjusting a control voltage to the replica circuit to set a resistance of the replica circuit at a value at which the voltage matches the swing command; and
generating the driver bias signal based at least in part on the adjusted control voltage.

16. An apparatus comprising:
means for generating a driver bias signal based on a swing command, a driver impedance characteristic, and an input signal;
means for adjusting a swing and an output impedance of a driver based at least in part on the driver bias signal; and
means for outputting a driver signal having the swing and the output impedance based, at least in part, on said adjusting,
the means for generating the driver bias signal automatically adjusting the driver bias signal such that the output impedance of the driver is varied to match an impedance of a given line; and further comprising:
a programmable swing control circuit configured to generate a swing control signal;
a plurality of pre-driver slices, each pre-driver slice being configured to output a driver bias
signal based on the swing control signal; and
a plurality of driver slices connected in parallel with commonly connected outputs, each
driver slice being configured to output a driver signal based on the driver bias signal from a corresponding pre-driver slice,
the programmable swing control circuit being configured to control the plurality of pre-driver slices to output the driver bias signals to automatically control output impedances of the plurality of driver slices, and each driver slice being capable of outputting a pull-up driver signal and a pull-down driver signal; and the output impedance of each driver slice being controlled such that an aggregate output impedance of the plurality of driver slices is a desired output impedance R_Spec, the aggregate output impedance being an impedance of parallel connected outputs of the plurality of driver slices.

17. The apparatus of claim 16, further comprising:
means for selecting between a first supply rail having a first voltage and a second supply rail having a second voltage different from the first voltage, based at least in part, on the swing command; and
means for regulating a voltage supplied to the driver from the selected one of the first supply rail and the second supply rail.

18. The apparatus of claim 16, the apparatus being integrated in at least one semiconductor die.

19. The apparatus of claim 16 further comprising a device, selected from the group consisting of a set top box, music player, video player, entertainment unit, navigation device, communications device, personal digital assistant (PDA), fixed location data unit, and a computer, into which the apparatus is integrated.

20. The regulated output impedance driver of claim 1, the driver comprising:
an output node;
a first bias-adjusted impedance leg, configured to switchably pull up the output node to a power supply rail; and
a second bias-adjusted impedance leg, configured to switchably pull down the output node to a ground rail,
the driver impedance characteristic being associated with an impedance through the first bias-adjusted impedance leg or through the second bias-adjusted impedance leg, or both.

21. The regulated output impedance driver of claim 20, the driver comprising:
a complementary output node;
a third bias-adjusted impedance leg, configured to switchably pull up the complementary output node to a power supply rail; and
a fourth bias-adjusted impedance leg, configured to switchably pull down the complementary output node to a ground rail,
the driver impedance characteristic being further associated with an impedance through the third bias-adjusted impedance leg or through the fourth bias-adjusted impedance leg, or both.

22. A line driver, comprising:
a programmable swing control circuit configured to generate a swing control signal;
a plurality of pre-driver slices, each pre-driver slice being configured to output a driver bias signal based on the swing control signal; and
a plurality of driver slices connected in parallel with commonly connected outputs, each driver slice being configured to output a driver signal based on the driver bias signal from a corresponding pre-driver slice,
the programmable swing control circuit being configured to control the plurality of predriver slices to output the driver bias signals to automatically control output impedances of the plurality of driver slices, and each driver slice being capable of outputting a pull-up driver signal and a pull-down driver signal; and the output impedance of each driver slice being controlled such that an aggregate output impedance of the plurality of driver slices is a desired output impedance R_Spec, the aggregate output impedance being an impedance of parallel connected outputs of the plurality of driver slices.

23. The line driver of claim 22,
the plurality of driver slices comprising N driver slices, N being more than one, and
each driver slice being controlled such that the output impedance of that driver slice is N×R_Spec.

24. The line driver of claim 22, at least one driver slice comprising:
a switchable pull-up unit-resistance element, a first end of the switchable pull-up unit-resistance element being coupled to a high supply voltage; and
a switchable pull-down unit-resistance element, a first end of the switchable pull-down unit-resistance element being coupled to a second end of the switchable pull-up unit-resistance element, and a second end of the switchable pull-down unit-resistance element being coupled to a low supply voltage, a voltage at a coupling node between the switchable pull-up unit-resistance element and the switchable pull-down unit-resistance element serving as the driver signal of the driver slice, when the switchable pull-up unit-resistance element is switched on, an impedance of the switchable pull-up unit-resistance element being control led to be at a target impedance, the target impedance being based on the R_Spec, and when the switchable pull-down unit-resistance element is switched on, an impedance of the switchable pull-down unit-resistance element being controlled to be at the target impedance.

25. The line driver of claim 24, the plurality of driver slices comprising N driver slices, N being more than one, and the target impedance being N×R_Spec.

26. The line driver of claim 22, the switchable pull-up unit-resistance element comprising a pull-up resistor in series with a voltage controlled pull-up resistor, the pull-up resistor having a fixed resistance and the voltage controlled pull-up resistor having a variable resistance, and the switchable pull-down unit-resistance element comprising a pull-down resistor in series with a voltage controlled pull-down resistor, the pull-down resistor having a fixed resistance and the voltage controlled pull-down resistor having a variable resistance.

27. A method to drive a line, comprising:

generating, using a programmable swing control circuit, a swing control signal;

outputting a driver bias signal from each of a plurality of pre-driver slices based on the swing control signal; and outputting a driver signal from each of a plurality of driver slices connected in parallel with commonly connected outputs based on the driver bias signal from a corresponding pre-driver slice, the swing control signal being generated to control the plurality of pre-driver slices to output the driver bias signals to automatically control output impedances of the plurality of driver slices, and each driver slice being capable of outputting a pull-up driver signal and a pull-down driver signal; and the output impedance of each driver slice being controlled such that an aggregate output impedance of the plurality of driver slices is a desired output impedance R_Spec, the aggregate output impedance being an impedance of parallel connected outputs of the plurality of driver slices.

28. The method of claim 27, the plurality of driver slices comprising N driver slices, N being more than one, and each driver slice being controlled such that the output impedance of that driver slice is N×R_Spec.

29. A line driving apparatus, comprising:

means for generating a swing control signal;

plural pre-driving means, each pre-driving means comprising means for outputting a driver bias signal based on the swing control signal; and plural driving means connected in parallel with commonly connected outputs, each driving means comprising means for outputting a driver signal based on the driver bias signal from a predriving means, the means for generating the swing control signal controlling the plural pre-driving means to output the driver bias signals to automatically control output impedances of the plural driving means, and each driving means being capable of outputting a pull-up driver signal and a pull-down driver signal; and the output impedance of each driving means being controlled such that an aggregate output impedance of the plural driving means is a desired output impedance R_Spec, the aggregate output impedance being an impedance of parallel connected outputs of the plural driving means.

30. The line driving apparatus of claim 29, there being N driving means, N being more than one, and each driving means being controlled such that the output impedance of that driving means is N×R_Spec.

31. The line driver of claim 22, the output impedance of each driver slice being controlled such that an aggregate output impedance of the plurality of driver slices is varied to match an impedance of a given line.

32. The method of claim 27, the output impedance of each driver slice being controlled such that an aggregate output impedance of the plurality of driver slices is varied to match an impedance of a given line.

33. The line driving apparatus of claim 29, the output impedance of each driving means being controlled such that an aggregate output impedance of the plural driving means is varied to match an impedance of a given line.

* * * * *